United States Patent
Yilmaz et al.

(10) Patent No.: US 10,447,504 B1
(45) Date of Patent: Oct. 15, 2019

(54) QUANTIZED DETECTION IN UPLINK MIMO WITH OVERSAMPLING

(71) Applicant: ORTA DOĞU TEKNİK ÜNİVERSİTESİ, Ankara (TR)

(72) Inventors: Ali Özgür Yilmaz, Ankara (TR); Ali Bulut Üçüncü, Ankara (TR)

(73) Assignee: ORTA DOGU TEKNİK ÜNİVERSİTESİ, Ankara (TR)

(*) Notice: Subject to any disclaimer, the term of this patent is extended or adjusted under 35 U.S.C. 154(b) by 2 days.

(21) Appl. No.: 15/980,895

(22) Filed: May 16, 2018

(51) Int. Cl.
*H04L 25/02* (2006.01)
*H03D 3/00* (2006.01)
*H04B 7/0417* (2017.01)

(52) U.S. Cl.
CPC ......... *H04L 25/0256* (2013.01); *H03D 3/006* (2013.01); *H04L 25/0204* (2013.01); *H04L 25/0242* (2013.01); *H04B 7/0417* (2013.01)

(58) Field of Classification Search
CPC ............ H04L 27/2649; H04L 27/2627; H04L 1/0071; H04L 1/0045; H04L 1/0057
See application file for complete search history.

(56) References Cited

U.S. PATENT DOCUMENTS

| | | | | |
|---|---|---|---|---|
| 7,433,402 B2 * | 10/2008 | Al-Dhahir | ............ | H04B 1/7103 375/233 |
| 2003/0095529 A1 * | 5/2003 | Petre | ............ | H04B 1/7105 370/342 |
| 2004/0120274 A1 * | 6/2004 | Petre | ............ | H04B 7/04 370/320 |
| 2007/0115799 A1 * | 5/2007 | Ting | ............ | H04B 7/0417 370/208 |
| 2017/0269206 A1 * | 9/2017 | Aoki | ............ | G01S 13/95 |
| 2018/0076847 A1 * | 3/2018 | Ju | ............ | H04B 1/525 |

* cited by examiner

*Primary Examiner* — Shuwang Liu
*Assistant Examiner* — Gina M Mckie
(74) *Attorney, Agent, or Firm* — Gokalp Bayramoglu

(57) ABSTRACT

The invention relates to a quantized detection in uplink mimo with oversampling that is a temporal oversampling in quantized uplink MIMO systems.

11 Claims, 5 Drawing Sheets

QUANTIZED DETECTION IN UPLINK MIMO WITH OVERSAMPLING

Technical Field

The invention relates to a quantized detection in uplink mimo with oversampling that is a temporal oversampling in quantized uplink MIMO systems.

Background

Owing to their low power consumption and cost, employing 1-bit analog-to-digital converters (ADC) in massive multiple-input multiple-output (MIMO) systems has attracted significant attention, which resulted in such systems to be examined widely in the recent literature. Multi-user multi-input multi-output (MIMO) systems have the advantage of providing support for multiple users by employing the same time-frequency resources, which promotes their use in the current and future communication systems. However, as the number of user terminals increase while the number of receive antennas are fixed, the amount of multi-user interference (MUI) increases, which may deteriorate the quality of service received by the users. Therefore, suppression of MUI becomes a critical issue for the scenarios where a significant number of user terminals are present, which is a possible scenario for next generation systems. MUI suppression is possible by increasing the number of base station antennas. This brings the employment of multi-user massive MIMO structures, in which a large number of base station antennas are present, to a critical position in future communication systems. In addition to their capability of suppressing MUI substantially, massive MIMO systems provide great advantages in terms of spectral and radiated energy efficiency and throughput.

However, the mentioned advantages come with some restrictions due to large number of antennas possessed by such systems. An important limitation is the high power consumption and implementation costs. In order for the power consumption and implementation costs to be maintained at feasible levels, employing a pair of low resolution analog-to-digital converters (ADC) for each antenna in the massive MIMO array is among the possible solutions. An additional motivation to employ low resolution ADCs is to maintain the data rates at feasible levels to be supported by common public interface (CPRI), which will especially be important for cloud radio access network (C-RAN) applications. Among the ADCs with small number of bits, one-bit ADCs have the lowest power consumption and implementation cost as they are composed of a single comparator and do not need automatic gain control units. This makes them favorable to be employed in massive MIMO systems.

Due to their aforementioned advantages of 1-bit ADCs, many studies investigated 1-bit quantized MIMO and massive MIMO systems in terms of achievable rate, capacity and error rate performance. The investigated case in those studies and the conventional receivers in uplink MIMO systems only considers the SR samples to detect the transmitted data symbols. This is not optimal under quantization noise. However, benefits of temporal oversampling, in which additional samples taken due to sampling faster than symbol rate are used to refine the data symbol estimates, are shown to exist for single-input single-output (SISO) scenarios under 1-bit quantization. The conventional receiver working with SR samples needs higher SNR or a larger number of receive antennas or can support limited number of users compared to the receiver that employs temporal oversampling in this invention.

Summary

This invention relates to a quantized detection in uplink mimo with oversampling. This invention proposes a receiver that employs temporal oversampling. With this invention:

Same symbol error rate (SER) can be obtained with lower SNR levels (up to 9 dB lower) or with smaller number of receive antennas (up to 70% decrease in the necessary number of antennas is possible) compared to the conventional zero-forcing (ZF) receiver that works with SR samples to obtain the data symbol estimates.

More users at further distance from tha base station can be supported with the same number of receive antennas by taking into account the faster-than-symbol-rate (FTSR) samples.

The invention can be directly used in the existing MIMO and massive MIMO base stations with high resolution ADCs Power consumption and the overall cost of the MIMO array can be reduced significantly.

Oversampling is performed in time domain

This invention shows that the necessary number of receive antennas to serve a fixed number of users maintaining a certain error-rate performance can be reduced significantly. This provides the advantage of reduced form factors, power consumption, deployment and maintenance costs for the MIMO base stations. Furthermore, the reduction in the necessary number of antennas to serve a fixed number of users implies that the number of users that can be served with a certain number of antennas will also be increased with temporal oversampling. By oversampling, the form factor, power consumption and the overall cost of the MIMO array can be reduced significantly. Moreover, the pronounced advantages regarding the necessary number of antennas also prevail with the proposed low complexity block sequential receiver as its performance can be observed to be close to the ZF receiver for both perfect and imperfect channel state information (CSI) cases.

Another aspect of the invention, wherein the detector is zero-forcing (ZF) detector.

Another aspect of the invention, wherein the detector is block sequential linear minimum mean squared estimate (BS-LMMSE) detector.

Another aspect of the invention, wherein the detector is characterized by G(r,H), based on the simple linear relation r=Q(Hx+n) and the derived oversampled channel matrix H, which is widely investigated in literature, for which various receiver types to estimate the transmit vector x are proposed (like linear minimum mean squared estimate, LMMSE, best-linear unbiased estimator BLUE, factor-graph based receivers, etc)

Another aspect of the invention, wherein the detectors utilizing temporal oversampling in uplink quantized MIMO systems G(r,H) reduce the necessary number of receive antennas to maintain a certain error rate performance significantly.

Another aspect of the invention, wherein the receiver schemes that take into account r and the derived oversampled channel matrix H are able to provide up to 4 dB signal-to-noise ratio (SNR) advantage compared to SR sampling in terms of error rate performance of 1-bit quantized uplink massive MIMO for narrowband fading channel scenario.

Another aspect of the invention, wherein the receiver schemes that take into account r and the derived oversampled channel matrix H are able to provide up to 9 dB signal-to-noise ratio (SNR) advantage compared to SR sampling in terms of error rate performance of 1-bit quantized uplink massive MIMO for wideband fading channel scenario.

Another aspect of the invention, wherein the special cases of the receiver schemes that take into account r and the derived oversampled channel matrix H, namely ZF and BS-LMMSE ($L''$=6, P=M/8) receivers, can reduce the necessary number of antennas to satisfy a SER of $10^{-3}$ by 70% for perfect CSI (when SNR=−12 dB) and 60% for imperfect CSI case (when SNR=−7 dB) by temporal oversampling.

Another aspect of the invention, wherein it provides up to 9 dB SNR advantage.

Another aspect of the invention, wherein the receiver is utilizing temporal oversampling in uplink quantized MIMO systems.

BRIEF DESCRIPTION OF THE DRAWINGS

The figures used to better explain quantized detection in uplink massive mimo with temporal oversampling developed with this invention and their descriptions are as follows.

DETAILED DESCRIPTION

Figure 1:
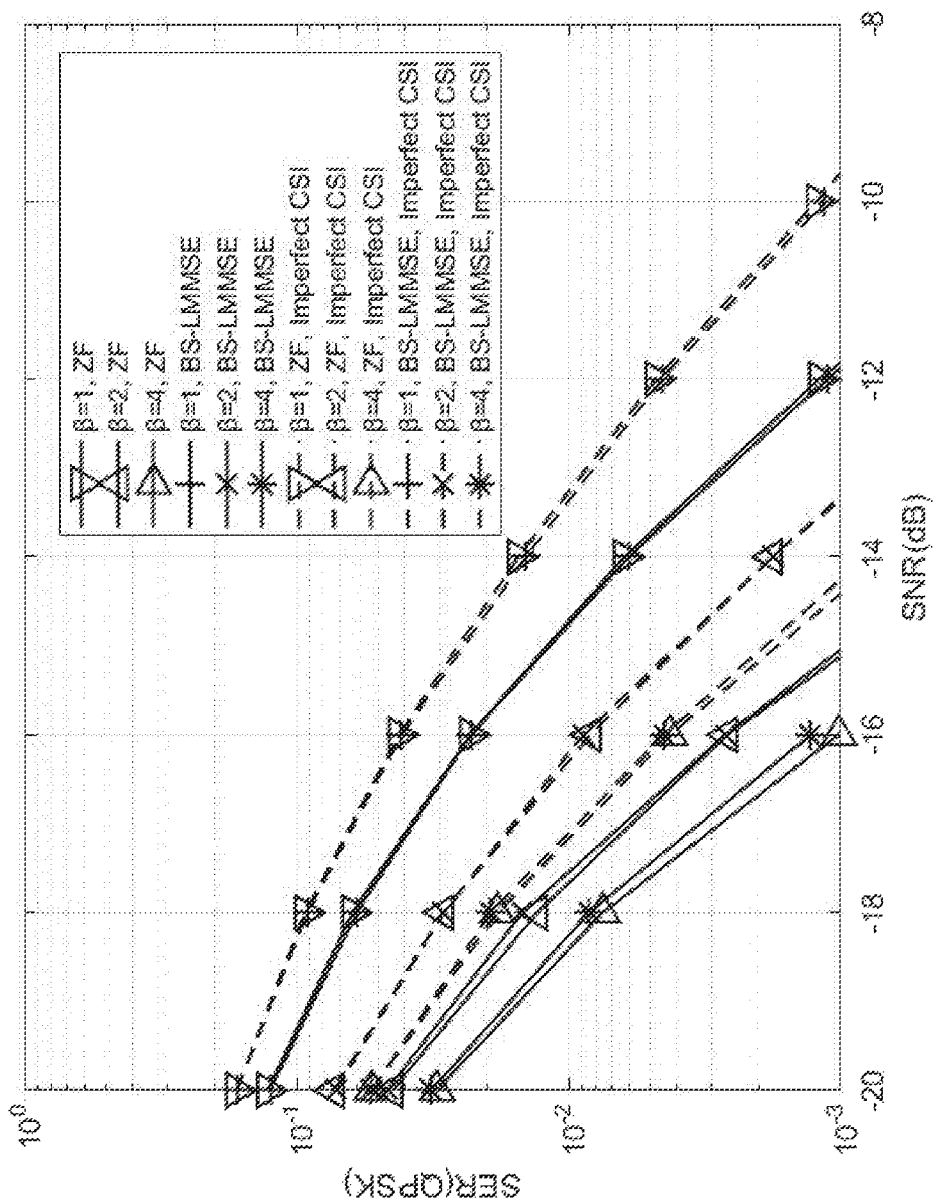
FIG. 1: Simulation based SER vs. SNR curves for M=400, K=20, oversampling rate β=1,2,4 with ZF and BS-LMMSE ($L''$=4, P=M/4) receivers for perfect and imperfect CSI ($\sigma_h^2$=0.2).

To better explain a quantized detection in uplink mimo with temporal oversampling developed with this invention, the details are as presented below.

This invention propose temporal oversampling in quantized uplink MIMO systems. In this invention receiver schemes are proposed for uplink (the data transmission is from users to base station). With this invention, the relation between the transmit data vector and the unquantized observation vector are obtained in linear form y=Hx+n, where y, x and n are the observation, data and noise vectors, respectively, by deriving the matrix H for oversampled case. This linear form is widely investigated in literature, for which various receiver types to estimate the transmit vector x are proposed (like linear minimum mean squared estimate, LMMSE, best-linear unbiased estimator BLUE, factor-graph based receivers, etc). The detectors providing an estimate for the transmitted data symbols x based on the quantized observation vector r, the derived oversampled channel matrix H and the simple relation between them r=Q(Hx+n), which are referred to as G(r,H), can provide significant advantages regarding error rate performances of such systems. This fact is shown by examining two examples of such detectors, namely zero-forcing (ZF) detector and block sequential LMMSE (BS-LMMSE) detector. The terms "receiver" and "detector" will be used interchangeably in this document. The block sequential receiver is of lower complexity compared to the ZF receiver. With the sub-example receivers we present, we show that the receiver schemes that take into account r and the derived oversampled channel matrix H are able to provide up to 4 dB signal-to-noise ratio (SNR) advantage compared to SR sampling in terms of error rate performance of 1-bit quantized uplink massive MIMO for narrowband fading channel scenario. For wideband fading channel case, this SNR advantage is up to 9 dB. This means that the cell coverage of the base stations incorporating massive MIMO arrays with low-resolution ADCs can be much larger if temporal oversampling is utilized. Moreover, with the receiver schemes G(r,H), we also show that the necessary number of receive antennas to serve a fixed number of users maintaining a certain error-rate performance can be reduced significantly. This provides the advantage of reduced form factors, power consumption, deployment and maintenance costs for the MIMO base stations. Furthermore, the reduction in the necessary number of antennas to serve a fixed number of users implies that the number of users that can be served with a certain number of antennas will also be increased with temporal oversampling.

Notation: b is a scalar, b is a column vector, $b_m$ is the $m^{th}$ element of vector b, B is a matrix, $B^H$ and $B^T$ represents the Hermitian and the transpose of C, respectively. Re(.) and Im(.) takes the real and imaginary parts of their operands and ||.|| represents the $L_2$ norm. I is an identity matrix and 0 is a zero vector of appropriate dimension.

Signal Model:

The received signal at the $m^{th}$ receive antenna for the wideband uplink multiuser MIMO system with K users and M receive antennas is written as $$r_m(t) = \sum_{\ell=0}^{L-1} \sum_{k=1}^{K} \sum_{n=1}^{N} h_{m,k}[\ell] x_{n,k} p_c(t - (n-1)T - t_\ell) + z_m(t), \quad (1)$$

where N is the block length, which is the number of symbols that are processed in a block, $h_{m,k}[\ell]$ is value of the channel impulse response between the $k^{th}$ user and the $m^{th}$ antenna at the time instant t=$t_\ell$, $p_c(t)$ is the transmit pulse shaping filter impulse response, $x_{n,k}$ is the complex valued symbol transmitted by the $k^{th}$ user at the $n^{th}$ symbol interval with unit average power so that $E[|x_{k,n}|^2]=1$ ∀k,n. T is the symbol period and $z_m(t)$ is an additive white Gaussian noise process at the $m^{th}$ antenna, whose each sample is a $\mathcal{CN}(0,\sigma_n^2)$ random variable, where $\mathcal{CN}(\mu,\sigma^2)$ represents a complex Gaussian random variable with mean μ and variance $\sigma^2$. The channel coefficients $h_{m,k}[\ell]$ are assumed to be independent $\mathcal{CN}(0,1/L)$ random variables, which represent Rayleigh fading and a uniform power delay profile channel scenario. The pulse matched filtered signal at the $m^{th}$ antenna, $g_m(t)=r_m(t)*p_c(-t)$, * representing the convolution operation, can be expressed as $$g_m(t) = \sum_{\ell=0}^{L-1} \sum_{k=1}^{K} \sum_{n=1}^{N} h_{m,k}[\ell] x_{n,k} p(t - (n-1)T - t_\ell) + d_m(t), \quad (2)$$

where $p(t)=p_c(t)*p_c(-t)$ and $d_m(t)=z_m(t)*p_c(-t)$. For case of demonstration purposes, we define vector a y as $$y = [\, y_{1,1} \quad y_{1,2} \quad \ldots \quad y_{1,M} \quad y_{2,1} \quad \ldots \quad y_{\beta N,M}\,]^T_{1 \times \beta MN}, \quad (3)$$

where $y_{n,m}=g_m((n-1)T=\beta)$, n=1, ..., $\beta$N, m=1, ..., M, $\beta$ being a positive integer oversampling rate, which is defined as the ratio of the total number of samples to the samples taken at symbol rate. Furthermore, vectors x and w are also defined as $$y = [\, x_{1,1} \quad x_{1,2} \quad \ldots \quad x_{1,K} \quad x_{2,1} \quad \ldots \quad x_{N,K}\,]^T_{1 \times NK}, \quad (4)$$

$$w = [\, w_{1,1} \quad w_{1,2} \quad \ldots \quad w_{1,M} \quad w_{2,1} \quad \ldots \quad w_{\beta N,M}\,]^T_{1 \times \beta MN}, \quad (5)$$

where $w_{n,m}=d_m((n-1)T=\beta)$, n=1, ..., $\beta$N, m=1, ..., M. In this case, (2) can be written in matrix-vector form as $$y = Hx + n, \quad (6)$$

where $$H = [\, G_1 \quad G_2 \quad G_3 \quad \ldots \quad G_N\,]^T, \quad (7)$$

in which $$G_n = \begin{bmatrix} \Gamma_n^0 & \Gamma_{n-1}^0 & \Gamma_{n-2}^0 & \ldots & \Gamma_{n-(N-1)}^0 \\ \Gamma_n^1 & \Gamma_{n-1}^1 & \Gamma_{n-2}^1 & \ldots & \Gamma_{n-(N-1)}^1 \\ \vdots & \vdots & \vdots & \vdots & \vdots \\ \Gamma_n^{\beta-1} & \Gamma_{n-1}^{\beta-1} & \Gamma_{n-2}^{\beta-1} & \ldots & \Gamma_{n-(N-1)}^{\beta-1} \end{bmatrix}^T_{MN \times NK}, \quad (8)$$

where $$\Gamma_i^m = \sum_{\ell=0}^{L-1} \gamma_{i,\ell}^m C_\ell, \quad \gamma_{n,\ell}^m = p((n-1)T + mT/\beta - t_\ell)$$

and $C_l$ is the matrix, whose element at its $m^{th}$ row and the $k^{th}$ column is equal to $h_{m,k}[l]$.

Under quantization of the received signal vector y, the signal model in (6) becomes $$r = Q(y) = Q(Hx + w), \quad (9)$$

where Q(.) is the quantizer function that maps the signal at its input to discrete levels. For instance, in 1-bit quantizer case, $Q(y)=\text{sgn}(\text{Re}(y))+j_{sgn}(\text{Im}(y))$, sgn(.) being the signum function. Moreover, the quantizer output r can be scaled to ensure that the variance of each element of y is the same as that of r, as performed for SR sampling and Lloyd-Max quantizer case in prior art. This scaling is important for the case when amplitude modulation (like QAM) is present for the data symbols, but has no significance when constant modulus type (like phase-shift keying, PSK) modulation is used for the data symbols. The estimate for the transmitted symbol vector $\hat{x}$ can be found as $$\hat{x} = G(r, H), \quad (10)$$

where G(.) is a function, either linear and non-linear, that yields the data vector estimate $\hat{x}$ based on the quantized observation vector r and the oversampled equivalent channel matrix H. For the case of linear receivers, $G(r,H)=D(Br)$, B being the linear receive matrix and D(.) is the function that maps the soft symbol estimates to the nearest constellation point to find the hard symbol estimate $\hat{x}$. For maximal-ratio combining or ZF combining $B=H^H K$ and $B=(H^H H)^{-1}H^H$, respectively, where K is a diagonal matrix whose $k^{th}$ diagonal element is equal to $1/\|h_k\|_2$, $h_k$ being the $k^{th}$ column of H.

In this invention, we prefer leaving the proposal of a channel estimation algorithm to the extended version of this invention. However, we take into account the impact of imperfect channel state information (CSI) as follows. We presume that the maximum likelihood (ML) estimates for the channel matrix $C_l$ are estimated with some method. Owing to the property of the ML estimates being asymptotically Gaussian and unbiased, we obtain the estimated channel matrix $C_l$, namely $\hat{C}_l$, by adding independent zero mean (since the estimates are unbiased) complex Gaussian random variables with variance $\sigma_h^2/L$ to each element of the matrix $C_l$. Then, $\hat{H}$ can be obtained from $\hat{C}_l$ using (7) and (8).

Block Sequential Linear Receiver:

This invention proposes a sequential type linear receiver as an alternative to the ZF receiver. The reason is that for ZF receiver, in which case $B=(H^H H)^{-1}H^H$, the number of multiplications to obtain B grows with $N^3$ due to inversion of $H^H H$. This makes the ZF receiver for oversampled uplink MIMO computationally prohibitive when the block length in a data packet goes high. One can propose using MRC receiver instead of ZF receiver, but it has been shown that MRC receiver suffers significantly from an error floor and performs worse in terms of error rate when oversampling is performed compared to the SR sampling case for 1-bit quantized case in prior art. Therefore, we seek to construct a sequential receiver that will provide the advantages that come with oversampling as in the linear ZF filter case and has a complexity that grows linearly with the block length N.

To derive a sequential linear receiver, we make some modifications in the signal model that we present in the system model section such that the derived receiver does not wait for the whole quantized observation vector r, which is of size $\beta MN$, to be obtained to update the estimate for the transmitted data symbol vector x. In (9), the quantized receive vector r is expressed as a function of the data symbol vector x. At this point, we define the observation vector at the time instant n, for which only the first nP elements of the quantized receive vector r are observed, while the remaining $\beta MN-nP$ elements are not observed yet. We denote this vector by r[n]. In this case, the observation model can be expressed as $$r[n] = Q(H[n]x + w[n]), \quad (11)$$

where $$r[n] = [\, r_1 \quad r_2 \quad \ldots \quad r_{nP}\,]^T, \quad (12)$$

$$w[n] = [\, w \quad w_2 \quad \ldots \quad w_{nP}\,]^T, \quad (13)$$

$$H[n] = \begin{bmatrix} H_p[1]^H \\ H_p[2]^H \\ \vdots \\ H_p[n]^H \end{bmatrix}. \quad (14)$$

In (14), $H_p[1]^H$ represents the matrix formed by taking the first P rows of matrix H. Similarly $H_p[1]^H$ and $H_p[n]^H$, represents the matrices formed by taking the second and the $n^{th}$ P rows of the matrix H, respectively. Moreover, in (12) and (13), $r_i$ and $w_i$ are the $i^{th}$ element of the vectors r and w, respectively. Denoting the soft estimate of vector x at the time instant n−1 as x'[n−1], which is calculated based on the observation vector at the time instant n−1, namely r[n−1]the aim is to update the estimate x'[n−1] to x'[n] using r[n]. Such an estimator can be defined with the following update equations performed at time instant n.

$$K[n] = \frac{M[n-1]\hat{H}_P[n]}{\sigma_n^2 I + \hat{H}_P[n]^H M[n-1]\hat{H}_P[n]}, \quad (15)$$

$$x'[n] = x'[n-1] + K[n][r_n - \hat{H}_P[n]^H x'[n-1]], \quad (16)$$

$$M[n] = [I - K[n]\hat{H}_P[n]^H] M[n-1], \quad (17)$$

where $$r_n = [\, r_{(n-1)P+1} \quad r_{(n-1)P+2} \quad \ldots \quad r_{nP}\,]^H, \quad (18)$$

K[n] can be denoted as the Kalman gain matrix, M[n] as the MMSE matrix and is the matrix formed by taking the $n^{th}$ P rows of matrix $\hat{H}$, which is the estimated version of matrix H. The execution of the update equations in (15)-(17) will also be referred to as the "$n^{th}$ iteration step of the sequential receiver". The size of the Kalman gain matrix K[n] is NK×P, whereas the size of the MMSE matrix M[n] is NK×NK. When no data is observed yet, the symbol estimate $\hat{x}$[n] and the MMSE matrix M[n] should be initialized using the prior information of the symbol estimates as follows.

$$x'[0] = E[x] = 0, \quad (19)$$

$$M[0] = E[xx^H] = I. \quad (20)$$

The equations (15)-(17) are the application of block Kalman filtering derived for unquantized observation model in prior art to the case of oversampled MIMO structure with quantization. The receiver characterized by the equations (15)-(17) will be referred to as block sequential LMMSE (BS-LMMSE) receiver. When P=1, the equations (15)-(17) correspond to the update equations for the sequential LMMSE for the unquantized observation model in prior art. We propose this estimation technique to be directly used with the quantized observations. With such a sequential estimation scheme, the matrix inversion in the ZF receiver is avoided.

An important advantage of the proposed sequential estimator is its ability to provide estimates for the data vector without having to wait for all observations taken for the whole data processing block (total number of observations for data processing block is βMN). For example, let the vector for the hard symbol estimates for the symbols transmitted at $p^{th}$ symbol interval be denoted as $\hat{x}^p$. It can be expressed as $$\hat{x}^p = [\, \hat{x}_{(p-1)K+1} \quad \hat{x}_{(p-1)K+2} \quad \ldots \quad \hat{x}_{pK}\,]^T, \quad (21)$$

where $\hat{x}_i$ corresponds to the $i^{th}$ element of the hard symbol estimate vector $\hat{x}$ for the transmitted symbol vector x defined in (4). Let the soft estimates for the symbols transmitted in the $p^{th}$ symbol interval at the $n^{th}$ iteration step of the sequential estimation algorithm be denoted as x'[n,p]. It can be written as $$x'[n, p] = [\, x'_{(p-1)K+1}[n] \quad x'_{(p-1)K+2}[n] \quad \ldots \quad x'_{pK}[n]\,]^T, \quad (22)$$

where x'$_i$[n] corresponds to the $i^{th}$ element of the vector x'[n]. Assuming that employed pulse shape decays to insignificant levels after L' symbol durations, the hard symbol estimate vector for the symbols transmitted at $p^{th}$ symbol interval $\hat{x}^p$ can be found by mapping the elements in the soft estimate vector for the transmitted symbols at $p^{th}$ symbol interval at the (Mβ(p+L")/P)$^{th}$ iteration step, namely x'[Mβ(p+L")/P,p], where L"=L+L'−1, to the minimum distance constellation point. In short, we make the hard decisions for the symbols transmitted at the $n^{th}$ symbol interval, whenever the observation for the (N+L")$^{th}$ symbol interval $r_{(n+L")\beta M/P}$ is taken. With this scheme, the maximum delay for the symbol decisions is L"T for all transmitted symbols, while the delay for ZF receiver can be up to NT, which is in general significantly larger than L"T.

Although the proposed sequential receiver characterized by (15)-(17) has the mentioned advantages, its complexity is still not low. For example, in (15), the complexity of the multiplication of matrix M[n−1], whose size is NK×NK, with $\hat{H}_p$[n], which is a matrix of size NK×P, grows with $N^2$. Repeating this multiplication for all iteration steps means that the complexity of the multiplications to estimate vector x at the end of all iterations grows with $N^3$, since the total number of iterations is βMN/P. Therefore, with the presented sequential receiver, the total number of multiplications still grows with $N^3$ similar to the ZF filter case. To reduce the complexity of the sequential receiver, we exploit the fact that the pulse shape decays to insignificant levels after a certain number of symbol durations (L') and the length of the channel impulse response is finite, thus it is not necessary to update all symbol estimates for every observation. The low complexity version of the sequential receiver is characterized by the following update equations that are performed at each iteration step.

$$K_\ell[n] = \frac{M_\ell[n-1]\hat{H}_{P_\ell}[n]}{\sigma_n^2 + \hat{H}_{P_\ell}[n]^H M_\ell[n-1]\hat{H}_{P_\ell}[n]}, \quad (23)$$

$$X_{\ell'}[n] = X_{\ell'}[n-1] + K_\ell[n][r_n - \hat{H}_{P_\ell}[n]^H X_{\ell'}[n-1]], \quad (24)$$

$$M_\ell[n] = [I - K_\ell[n]\hat{H}_{P_\ell}[n]^H] M_\ell[n-1], \quad (25)$$

where $$X_{\ell'}[n] = [\, x'[n]_{n_b} \quad x'[n]_{n_b+1} \quad \ldots \quad x'[n]_{n_g}\,]^T, \quad (26)$$

$$\hat{H}_{P_\ell}[n] = [\, \hat{h}[n]_{n_b}^T \quad \hat{h}[n]_{n_b+1}^T \quad \ldots \quad \hat{h}[n]_{n_g}^T\,]^T, \quad (27)$$

$$M_\ell[n] = \begin{bmatrix} M_\ell[n]_{n_b,n_b} & \ldots & M_\ell[n]_{n_b,n_g} \\ \vdots & \ldots & \vdots \\ M_\ell[n]_{n_g,n_b} & \ldots & M_\ell[n]_{n_g,n_g} \end{bmatrix} \quad (28)$$

In (26) and (27), x'[n]$_i$ corresponds to the $i^{th}$ element of the vector x'[n] and $\hat{h}$[n]$_i$ refers to the $i^{th}$ row of matrix $\hat{H}_p$[n] and M$_\ell$[n]$_{i,j}$ corresponds to the element of matrix M$_\ell$[n] at its $i^{th}$ row and $j^{th}$ column. Moreover, the indexes $n_b$=($n_i$−L)N$_t$ and $n_s$=($n_i$+L)N$_t$, where index $n_i$ specifies the current symbol interval that the observations are being taken from at the $n^{th}$ iteration of the sequential receiver and is equal to $\lfloor$(nP−1)/ M/β+1$\rfloor$, where $\lfloor$.$\rfloor$ is the floor function that gives the largest integer less than its operand. In this setting for the sequential receiver, the size of the Kalman gain matrix $K_l[n]$ and the MMSE matrix $M_l[n]$ becomes $(2LN_r+1) \times P$ and $(2LN_r+1) \times (2LN_r+1)$ and they can be initialized as in (19) and (20). For the low complexity version of the sequential receiver characterized by (23)-(25), the number of complex multiplications in the update equations (23)-(25) do not change with the block length N since the sizes of $H_{p_l}[n-1]$, $x'_l[n-1]$ and $M_l[n-1]$ are $(2LN_r+1) \times P$, $(2LN_r+1) \times P$ and $(2LN_r+1) \times (2LN_r+1)$, respectively, which are all independent of N. Since there are $\beta MN/P$ iterations, the number of complex multiplications grows with N compared to $N^3$ for the ZF receiver and the high complexity version of the sequential characterized by (15)-(17). Moreover, for the low complexity sequential receiver, the number of complex multiplications per estimated symbol of each user does not change with N since each user transmits N symbols in the whole data block.

Simulation Results:

Number of users (K) and receive antennas (M) are taken to be 20 and 400, respectively. The block length N) is selected to be 10 symbols and the oversampling rate (β) is chosen between 1 and 4. The roll-off factor (ρ) for the root-raised cosine (RRC) pulse shape is taken to be 0.22. For narrowband channel scenario plots L=1 and L"=4. For frequency selective channel simulations, $t_l$=lT, L=3 and L"=6. Modulation type is selected to be QPSK. The solid curves in all figures represent the perfect CSI cases, whereas the dashed curves correspond to the imperfect CSI cases. Moreover, while the curves with markers with triangular shape indicate the performance of ZF receiver, the curves with other type of markers correspond to the performance of BS-LMMSE receiver. The SNR values on the plots are equal to $1/\sigma_n^2$.

The error rate performances of BS-LMMSE receiver and ZF receiver are obtained by simulations and plotted in FIG. 1 when oversampling rate β is from 1 (no oversampling) to 4 (4 times oversampling) for perfect and imperfect CSI cases. For imperfect CSI cases, $\sigma_h^2$=0.2. The parameters L"=4, P=M/4 for BS-LMMSE receiver.

As can be noted in FIG. 1, oversampling with ZF receiver provides up to 4 dB SNR advantage compared to the SR sampled case for both perfect and imperfect CSI cases when the SNR values to maintain a symbol error rate (SER) of $10^{-3}$ are considered. Moreover, the error rate performance of the lower complexity BS-LMMSE is similar to the performance of ZF receiver under both perfect and imperfect CSI cases. This means that the 4 dB SNR advantage provided by oversampling with ZF receiver compared to the SR sampled case is maintained with the lower complexity BS-LMMSE receiver.

Figure 2:
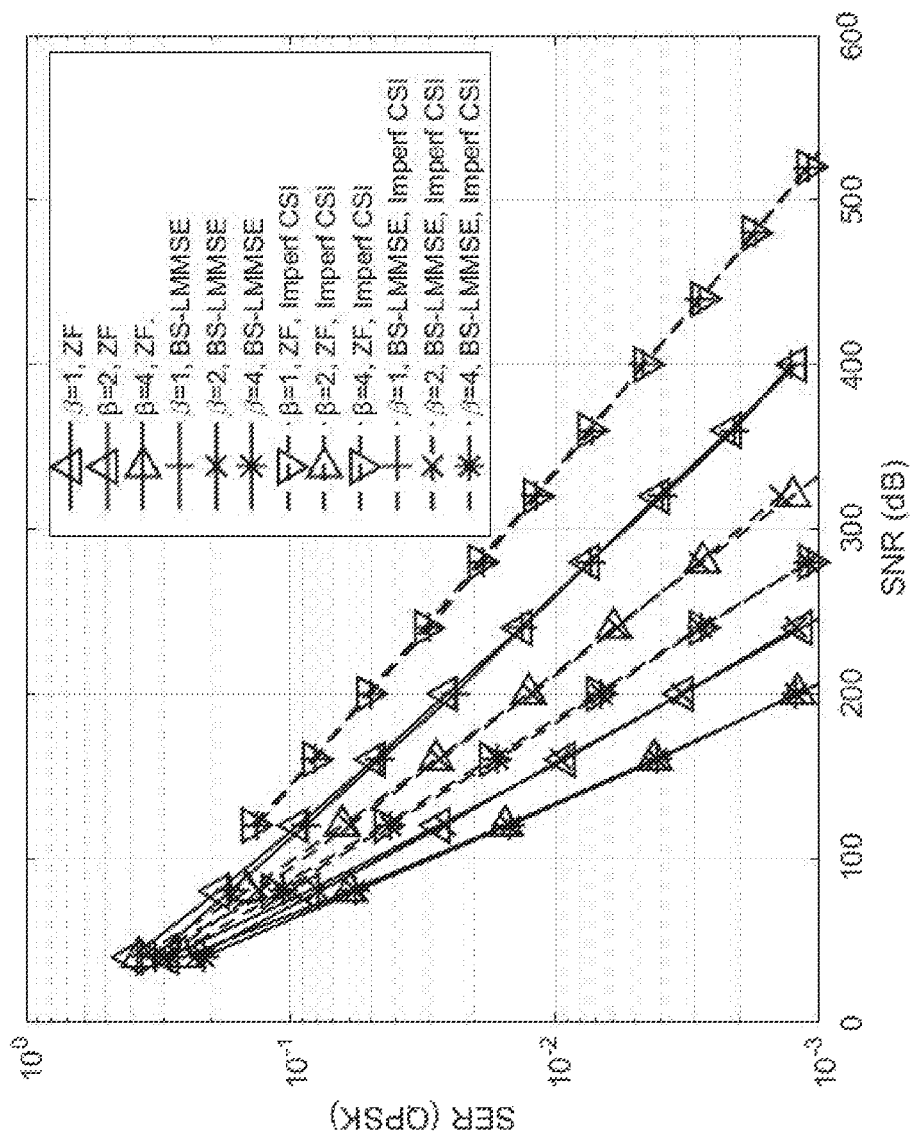
FIG. 2: Simulation based SER vs number of receive antennas (M) for oversampling rate β=1,2,4 with ZF and BS-LMMSE receivers ($L''$=4, P=M/8) when SNR=−12 dB for perfect and imperfect CSI ($\sigma_h^2$=0.2).

We also present SER versus the number of receive antennas when SNR is fixed as −12 dB in FIG. 2. As can be inferred from FIG. 2, number of antennas necessary to maintain a SER of $10^{-3}$ can be halved by temporal oversampling with ZF receiver. This means that by oversampling, the form factor, power consumption and the overall cost of the MIMO array can be reduced significantly. Moreover, the pronounced advantages regarding the necessary number of antennas also prevail with the proposed low complexity receiver as its performance can be observed to be close to the ZF receiver in FIG. 2 for both perfect and imperfect CSI cases.

Figure 3:
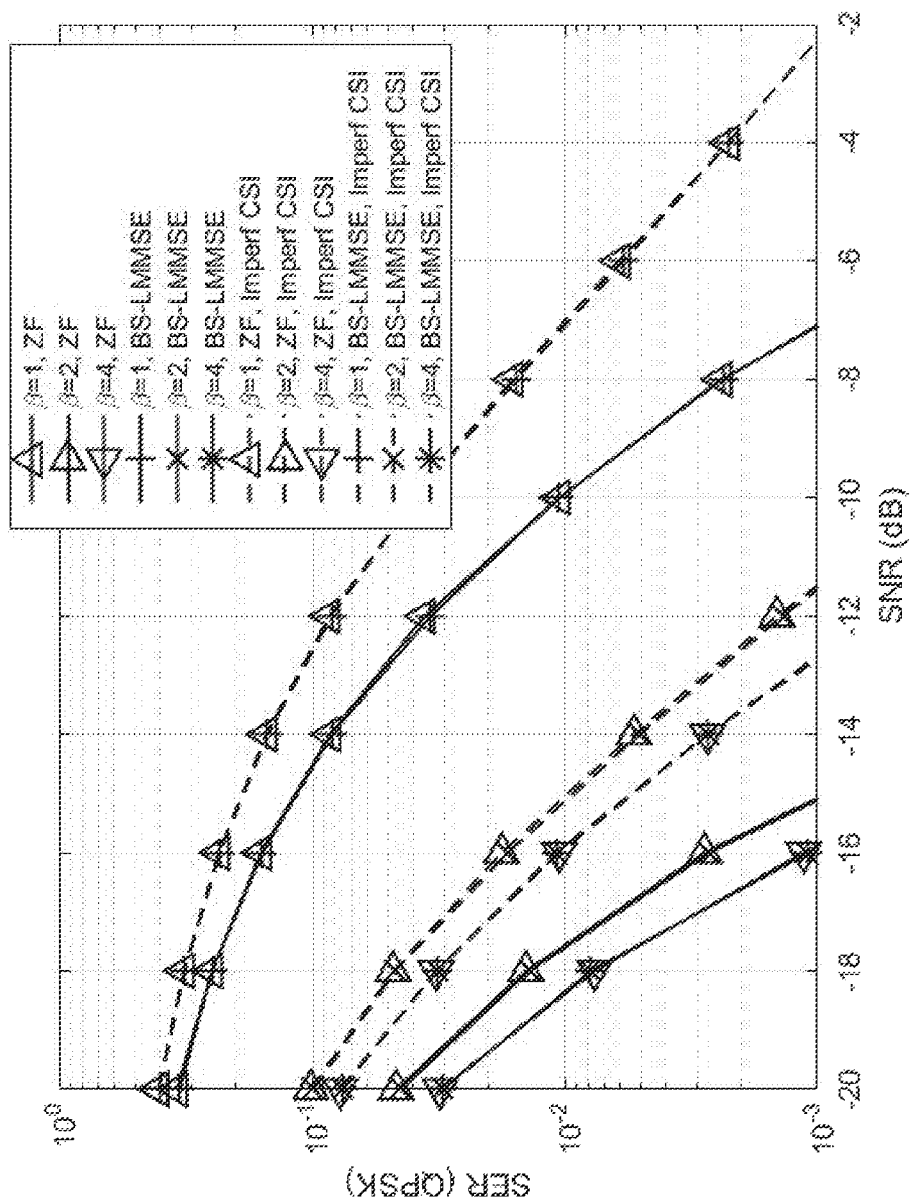
FIG. 3: Simulation based SER vs SNR curves for oversampling rate β=1,2,4 with ZF and BS-LMMSE ($L''$=6, P=M/4) receivers for frequency selective channel (L=3) for perfect and imperfect CSI ($\sigma_h^2$=0.4).

In FIG. 3, we repeat the error-rate simulations for frequency selective channel (L=3). For frequency selective case, the SNR advantage obtained by oversampling with ZF or BS-LMMSE receiver is up to 9 dB compared to the SR sampled case for both perfect and imperfect CSI cases when the SNR values to maintain a symbol error rate (SER) of $10^{-3}$ are considered.

Figure 4:
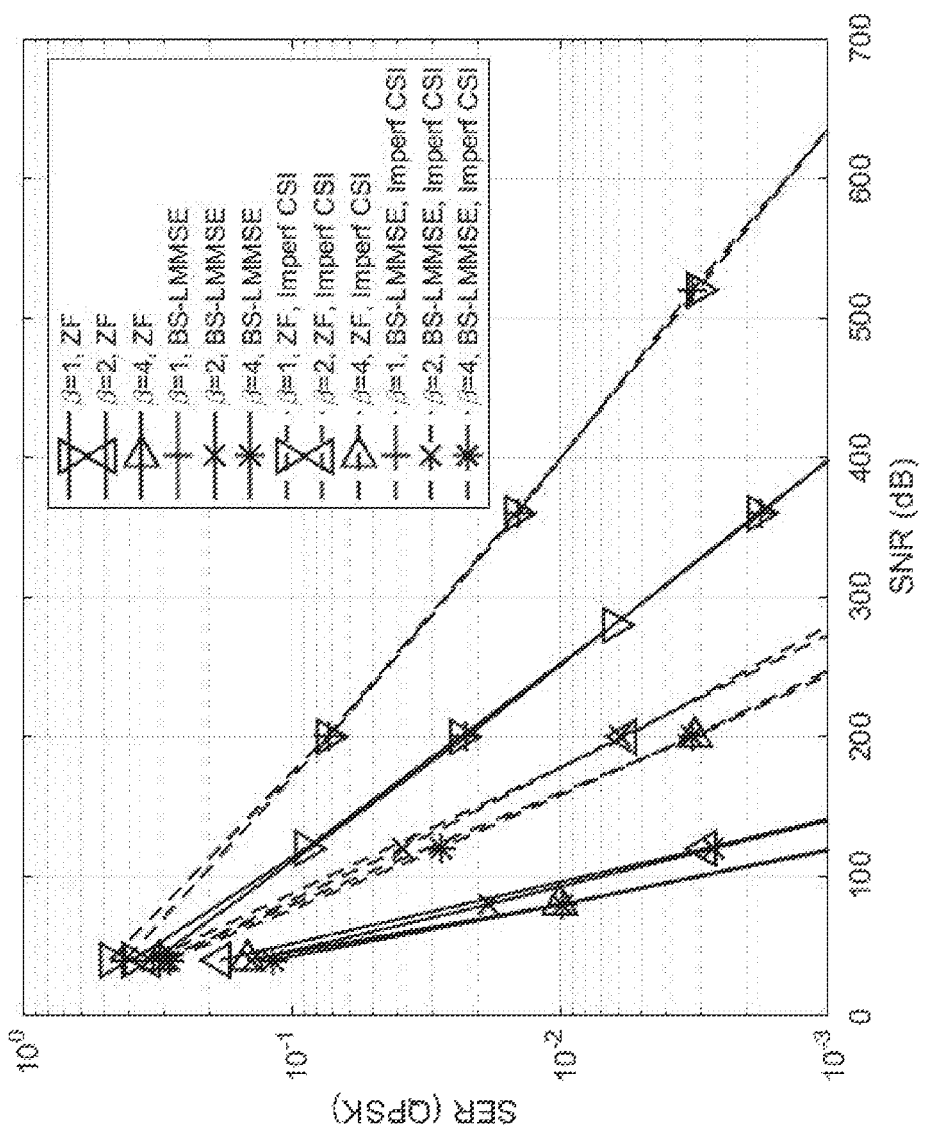
FIG. 4: Simulation based SER vs number of receive antennas (M) for oversampling rate β=1,2,4 with ZF and BS-LMMSE receivers ($L''$=6, P=M/8) for frequency selective channel (L=3) when SNR=−7 dB for perfect and imperfect CSI ($\sigma_h^2$=0.4).
Figure 5:
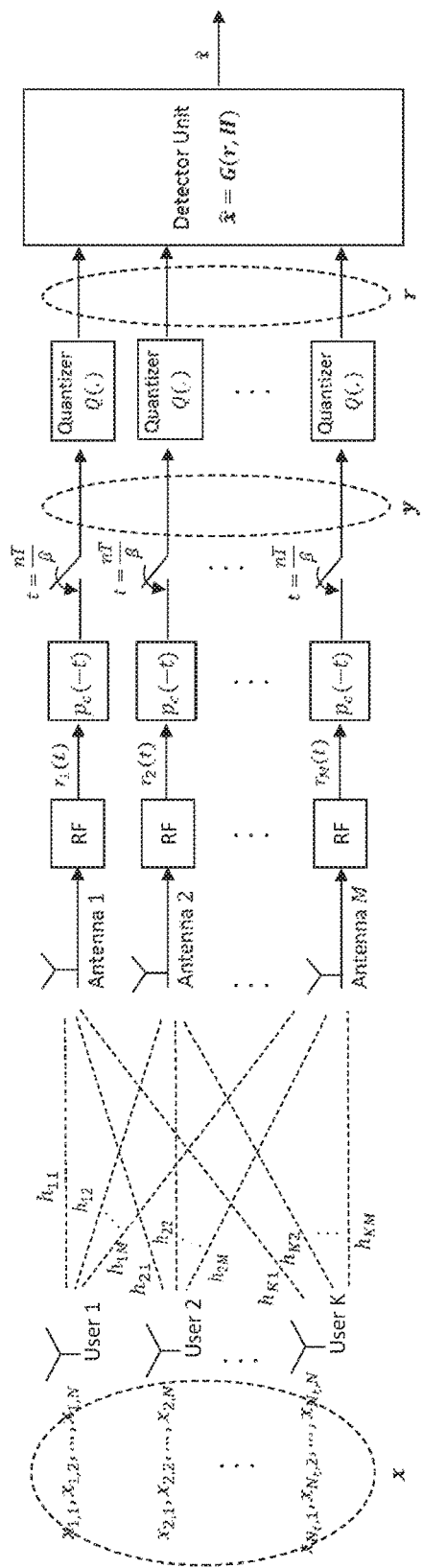
FIG. 5: System diagram

To demonstrate the advantage of oversampling in terms of the necessary number of receive antennas for frequency selective channel case, SER versus the number of receive antennas when SNR is fixed as −7 dB is presented in in FIG. 4. As can be seen in FIG. 4, number of antennas necessary to maintain a SER of $10^{-3}$ can be reduced from 400 to 120 (70% decrease) for perfect CSI and from about 630 to 240 (about 60% decrease) for imperfect CSI case by temporal oversampling with ZF receiver. Moreover, the pronounced advantages regarding the necessary number of antennas also continue with the proposed low complexity receiver as its performance can be observed to be close to the ZF receiver in FIG. 4 for both perfect and imperfect CSI cases.

The detectors utilizing temporal oversampling in uplink quantized MIMO systems reduce the necessary number of receive antennas to maintain a certain error rate performance significantly.

From the above detailed description, a receiver scheme comprising; the method of a quantized detection in uplink mimo with oversampling which takes samples faster than the symbol rate for uplink MIMO with 1-bit ADC and comprising the steps of;

obtaining the relation between the transmitted data symbols x and the quantized temporally oversampled observation vector r in a simple form y=Hx+n, by deriving matrix H, providing an estimate for the transmitted data symbols x based on the quantized observation vector r, matrix H and the derived simple relation between them r=Q(Hx+n) by detectors (receivers).

What is claimed is:

1. A method of a quantized detection in an uplink mimo with oversampling which takes samples faster than a symbol rate for the uplink MIMO with a 1-bit ADC, the method comprising the steps of:

obtaining a relation between transmitted data symbols x and a quantized temporally oversampled observation vector r in a simple form y=Hx+n, by deriving an oversampled channel matrix H, a detector providing an estimate for the transmitted data symbols x based on the quantized temporally oversampled observation vector r, the oversampled channel matrix H and a derived simple relation between the oversampled channel matrix H and the quantized temporally oversampled observation vector r=Q(Hx+n); wherein Q(Hx+n) is a quantizer function mapping an input of a quantizer to discrete levels, and n is a noise vector; and wherein the detector utilizes a temporal oversampling in the uplink quantized MIMO method.

2. The method of claim 1, wherein the detector is a zero-forcing (ZF) detector.

3. The method of claim 1, wherein the detector is a block sequential linear minimum mean squared estimate BS-LMMSE detector.

4. The method of claim 1, wherein the detector is characterized by G(r,H), based on the derived simple linear relation r=Q(Hx+n) and the derived oversampled channel matrix H, for which receiver estimates a transmit vector x.

5. The method of claim 4, wherein the detector is a linear minimum mean squared estimate or a best-linear unbiased estimator BLUE or a factor-graph based receiver.

6. The method of claim 1, wherein the detector utilizing the temporal oversampling in the uplink quantized MIMO method G(r,H) reduces a necessary number of receiver antennas to maintain a predetermined error rate.

7. The method of claim 1, wherein the detector takes into account the quantized temporally oversampled observation vector r and the derived oversampled channel matrix H to provide up to a 4 dB signal-to-noise ratio (SNR) advantage compared to SR sampling in terms of an error rate performance of a 1-bit quantized uplink MIMO for narrowband fading channel scenario.

8. The method of claim 1, wherein the detector takes into account the quantized temporally oversampled observation vector r and the derived oversampled channel matrix H to provide up to a 9 dB signal-to-noise ratio (SNR) advantage compared to SR sampling in terms of an error rate performance of a 1-bit quantized uplink MIMO for wideband fading channel scenario.

9. The method of claim 1, wherein the detector is ZF and BS-LMMSE ($L''=6$, $P=M/8$) detectors, and the detectors reduce a necessary number of antennas to satisfy a SER of $10^{-3}$ by 70% for perfect CSI when SNR=−12 dB and by 60% for an imperfect CSI case when SNR=−7 dB by temporal oversampling.

10. The method of claim 1, wherein the detector provides up to a 9 dB SNR advantage with up to 70% decrease in the number of receiver antennas.

11. A quantized uplink MIMO system using the method of claim 1.

* * * * *